United States Patent [19]

Galvagni et al.

[11] Patent Number: 4,830,723
[45] Date of Patent: May 16, 1989

[54] METHOD OF ENCAPSULATING CONDUCTORS

[75] Inventors: John Galvagni, Myrtle Beach, S.C.; Robert A. Miller, Walden, N.Y.

[73] Assignees: AVX Corporation, Great Neck; IBM Corporation, Armonk, both of N.Y.; part interest to each

[21] Appl. No.: 209,588

[22] Filed: Jun. 22, 1988

[51] Int. Cl.⁴ .................. C23C 14/34; C23C 14/24
[52] U.S. Cl. ....................... 204/192.17; 204/192.15; 204/298; 427/282; 118/505
[58] Field of Search .............. 204/192.15, 192.17, 204/298 MS; 427/282; 118/504–505

[56] References Cited

U.S. PATENT DOCUMENTS 4,561,954 12/1985 Scrantom et al. .............. 204/192.15
4,741,077 5/1988 Langlois ............................. 29/25.42

Primary Examiner—Aaron Weisstuch
Attorney, Agent, or Firm—Arthur B. Colvin

[57] ABSTRACT

A method of forming successive metal layers of varying widths on a substrate is disclosed. A mask having a through going aperture is provided, the mask including a constricted neck portion between its upper and lower surfaces. Successive metal layers are applied over the substrate through the aperture in the mask sequentially by sputtering methods which form a metallic layer wider than the constricted neck portion of the mask and by vapor deposition method which forms a narrower metal layer corresponding to the transverse dimension of the constricted portion of the mask.

5 Claims, 1 Drawing Sheet

METHOD OF ENCAPSULATING CONDUCTORS

BACKGROUND OF THE INVENTION

1. Field of the Invention

The present invention is in the field of forming metallic conductors and relates more particularly to a method of depositing encapsulated conductive paths on a substrate.

2. Prior Art

In the manufacture of electronic components such as resistors, capacitors and the like it is often necessary to effect electrical connection to or between one or more terminals exposed at a surface of the component, the terminals being in electrical connection with functional elements of the component buried within the body of the device. By way of example, and without limitation, a capacitor may be comprised of a ceramic monolith having a number of buried electrodes. The electrodes may include spaced tabs extending to a surface of the monolith. With a structure as described, the capacitance of the device may be adjusted by electrically connecting all or less than all of the exposed tabs to achieve a desired value.

It is often necessary, for a given electrical component, to form a multiplicity of such conductive paths on a given surface of the component, for instance to form respective conductive paths linking the electrodes of opposite polarity of a capacitor, or for forming discreet capacitors within a single monolith.

The formation of conductive paths on the surface of electronic components is complicated by the fact that it is often necessary that the conductive paths be comprised of a series of superposed layers. By way of example, due to such factors as migration and chemical interaction it is necessary first to apply a metallic layer which is compatible with the material of the exposed tabs. Such material may not provide an ideal conductor or may be expensive and hence its use in limited quantities is called for. In order to render the path suitably conductive, it may thereafter be necessary to apply a second, highly conductive metal which will not adversely react with the first applied layer but which could not be directly contacted with the tabs. Thereafter, in order to shield the highly conductive layer from effects such as oxidation, it may be desired to overcoat the highly conductive layer with a still further layer compatible with the other layers and resistant to oxidation.

The formation of metallic conductive paths by such metal deposition steps as plating, sputtering, and ion deposition, is well known. Heretofore, the formation of conductive paths having superposed layers has involved the use of multiple masks which must be sequentially applied in accordance with the width of the desired conductive path. If, for instance, it is desired to apply a conductor comprised of an aluminum layer encapsulated within upper and lower passivating tungsten layers, the procedure heretofore practiced was to mask the electronic component with a first wide mask, apply a tungsten layer, remove the first mask and position a narrower mask in registry with the deposited tungsten layer, apply a narrower strip of aluminum within the opening of the second applied mask, remove the second mask and re-mask the device with a third mask of greater width than the mask used to apply aluminum, and deposit the covering tungsten layer through the third and wider mask.

As will be apparent to those skilled in the art, steps of masking and re-masking involve significant problems of accuracy in mask location, considering particularly that the electronic components may, in their largest dimension, be only fractions of an inch in size.

Patents relating to metal deposition methods of various sorts but which fail to provide a solution to the above referenced problem include:

(A) U.S. Pat. No. 4,536,942. This patent relates to forming a T-shaped electrode by sequential angular and perpendicular metal deposition steps.

(B) U.S. Pat. No. 4,580,331 teaches angular evaporation of applied photo-resist to achieve a desired patterning effect.

(C) U.S. Pat. No. 4,024,041 discloses the use of a mask having a thermally stable elastic membrane on its under surface so as to prevent the spread of metal deposited through an aperture in the mask.

(D) U.S. Pat. No. 4,171,234 discloses a method of forming a crystal having a desired epitaxial crystal growth factor through the use of molecular beams angularly oriented with respect to the target crystal.

(E) U.S. Pat. No. 4,330,932 discloses a process for forming a semi-conductor device which includes depositing a thin film on a substrate through first mask, implanting the depositing film with a dopant, thereafter positioning a second mask over the noted films and depositing an electrical contact through the second mask.

(F) U.S. Pat. No. 4,410,401 discloses a material deposition step wherein the depositing device includes a shutter having an object obscuring portion, the device being adapted to remove contaminants by collecting the same in a trap formed on the object obscuring portion of the shutter.

(G) U.S. Pat. No. 4,060,427 discloses a method of forming an integrated circuit through a combination of ion implantation and diffusion steps. The process includes depositing first and second mask forming layers on the substrate, cutting a narrow aperture in the upper mask forming surface, forming a wider aperture in the lower mask forming surface to define an undercut, forming a first ion implantation area through the mask and thereafter forming by diffusion a wider layer extending to the limits of the undercut portion.

SUMMARY OF THE INVENTION

The present invention may be summarized as directed to a method of laying down mutually encapsulating conductive metallic paths. In accordance with the method of the invention, a mask is provided characterized in that the substrate adjacent surface of the mask is wider than other portions of the mask spaced from the substrate. A first path is deposited by a vacuum deposition step which results in the formation of a path the width of which corresponds to the narrowest dimension of the mask. Thereafter a further metallic layer is deposited by a sputtering step. The sputtering process results in the formation of a metallic layer which corresponds in width to the widest dimension of the mask due to the tendency of sputter deposited materials to spread. In this manner, metallic layers of various widths can be deposited through a single mask which need not be moved until the deposition has been completed.

It is accordingly an object of the invention to provide a method for forming conductive paths of various widths through a single mask which need not be replaced during the deposition steps used to form the paths.

DETAILED DESCRIPTION OF THE DRAWINGS

Figure 1:
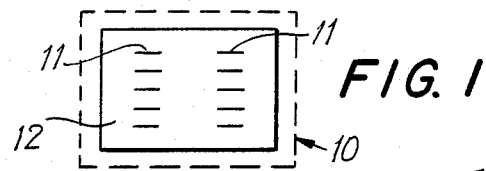
FIG. 1 is a plan view schematically depicting an electronic device of the type with which the method of the instant invention may be usefully employed.

Referring now to the drawings, there is shown in FIG. 1 a typical electronic device, illustratively a capacitor 10. The capacitor, which may be of the multilayer ceramic type, includes a multiplicity of electrodes of opposite polarity. In order to employ the capacitor in an electrical circuit it is necessary to form electrical connections on the capacitors which link various of the buried electrodes of like polarity, the terminations being susceptible of being soldered into or otherwise linked to the circuit.

In the embodiment illustrated in FIG. 1, the electrodes of the capacitor include upwardly extending tabs 11 exposed on the uppermost surface 12 of the capacitor. Thus, in order to make the capacitor a useful electronic device conductive materials must be deposited over the tabs.

Illustratively, and without limitation, it is often necessary or desirable that the conductive materials be comprised of multiple layers, and particularly layers encapsulated within other layers. By way of example, certain metallic material while providing excellent conductive properties cannot bond adequately to the surface of the ceramic and thus the use of such metals as the initial or tab engaging layer is counter indicated. Still other metals may bond adequately to the ceramic but offer an unreasonably high resistance. Additional factors to be considered in determining upon the composition of the conductor paths include the tendency of certain metals to react with the metal of which the tabs are comprised with the result that over time the connection between conductor and tab may deteriorate. Still a further consideration is the fact that certain highly conductive metals, if exposed to ambient conditions, may oxidize, impeding the ability to provide an effective external electrical connection to the metals. From the foregoing, it will be appreciated that for a variety of reasons it is highly desirable to enable accurate application of superposed conductive paths of varying widths without the necessity of masking and remasking.

Figure 2:
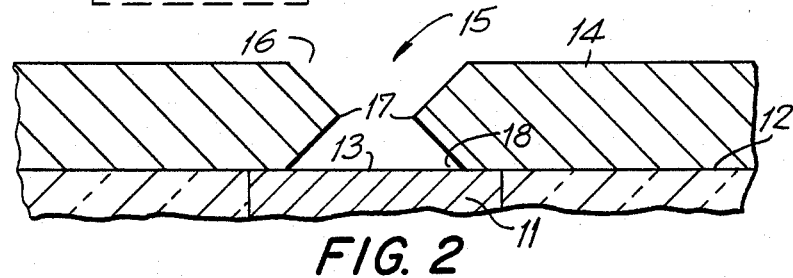
FIGS. 2 through 5 are schematic views depicting the progressive stages of practice of the method in conjunction with a substrate and mask in accordance with the invention.

Referring now to FIGS. 2 through 5 there is disclosed in FIG. 2 a fragmentary section of the capacitor of FIG. 1. Illustratively, a tab 11 has an uppermost surface 13 exposed at the upper face 12 of the capacitor. In order to effect the formation of conductive paths linking the series of tabs 11 there is provided, in accordance with the invention, a mask member 14 formed preferably of metal. The mask member 14 is superposed over the capacitor 10 so as to overlie the upper surfaces 13 of the tabs to be connected by a conductive path or buss.

A characterizing feature of mask 14 resides in the configuration of the aperture 15 through which metal for forming the conductive paths is to be deposited. More particularly, the mask includes a wide entrance area 16, a narrow waist area defined by opposed knife edges 17, 17, and a wide base area 18 at the capacitor adjacent surface.

As previously noted, the method of the instant invention is dependent upon the use of alternative deposition processes which inherently result in varying deposition patterns. More specifically, reliance is made upon the fact that a sputtering deposition procedure known per se which is performed under a pressure of from about $10^{-2}$ to $10^{-3}$ TORR is characterized by deposition of atoms in a scattered path. In contrast, a vacuum deposition process which is typically carried out in a more highly evacuated atmosphere having a pressure on the order of about $10^{-4}$ TORR or less results in movement of the atomic particles in a long mean path so as to be essentially free from scattering.

Figure 3:
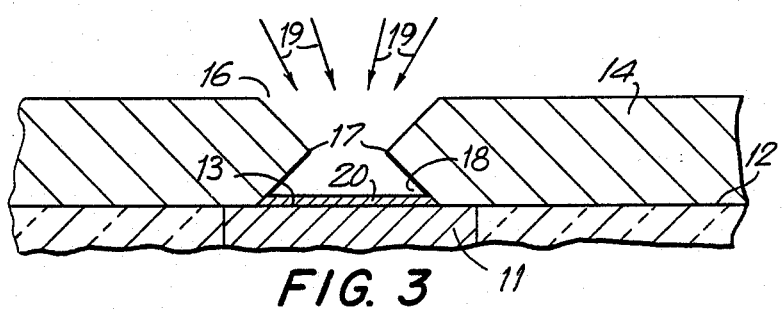

Referring now to FIG. 3, the masked capacitor is subjected to an initial sputtering step which results in deposition of metallic particles, illustratively tungsten atoms, along a variety of angular paths represented by the arrows 19. The deposition step illustrated in FIG. 3 will result in the formation on the surface 12 in registry with the tabs 11 of a metallic layer 20 which essentially fills the entirety of the wide base area 18. The configuration of the mask, which is wider at its upper and lower surfaces but narrow in the intermediate areas between knife edges 17, thus results in the formation of the relatively wide strip of metal 20 which is approximately coincident in width with the width with the base portion 18.

After deposition of the metal layer 20, the masked capacitor is thereafter subjected to a vapor deposition step wherein metallic particles, illustratively of aluminum, are deposited in the direction of arrows 21. Due to the essentially linear and unscattered deposition paths which inhere in the vapor deposition step, only those particles which are in registry with the area between knife edges 17, 17 will pass through the mask, such particles forming a narrower strip of metal 22 superposed over the first deposited metallic layer 20. As is apparent from FIG. 4 the layer 22 covers only a central portion of the first deposited layer 20.

Figure 4:
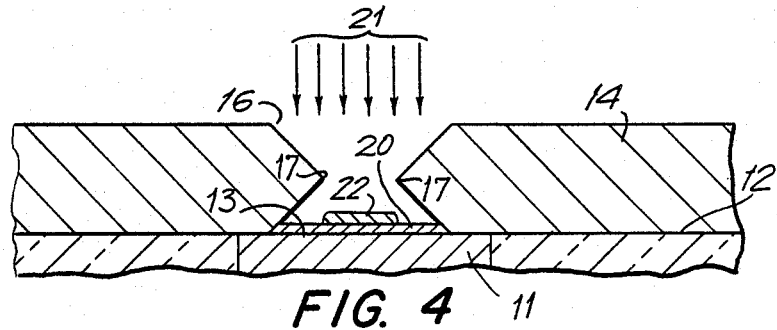
Figure 5:
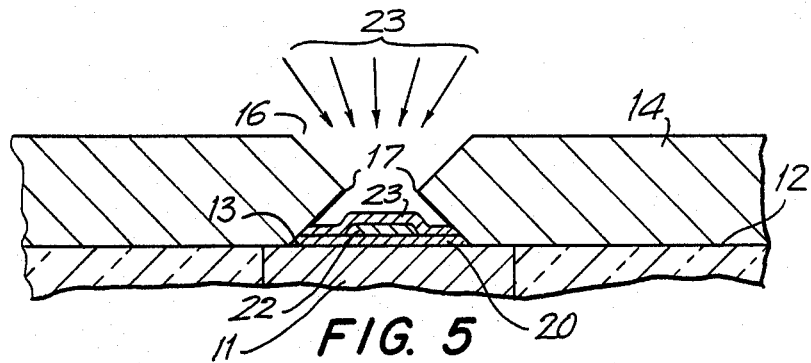

In FIG. 4 the mask and substrate are again subjected to a sputtering step wherein atomic particles are deposited in the direction of the arrows 23. In view of the scattered direction of deposit, particulate material is deposited in a wider path than the opening defined between knife edges 17, 17 with result that there is formed a covering layer 23, illustratively of tungsten, superposed over layer 22 as well as over the portions of layer 20 not covered by layer 22. It will thus be apparent that there is formed an encapsulated layer 22 disposed between upper and lower layers 23 and 20 respectively, which had been deposited by the sputtering step.

While the procedure, in accordance with the invention, may be effectively practiced utilizing a variety of mask sizes, some illustrative values are believed desirably provided to demonstrate the best currently known mode of practicing the invention. Satisfactory results have been achieved using a mask thickness of between 3 and 8 mils. The pattern width should be within a ratio of from about 0.75 to about 1.5 times the mask thickness. It has been found that the use of too thick a mask is counter indicated since the effective difference between the two metalization processes diminishes under such circumstances. In an illustrative procedure which has been effectively carried out, a 4 mil thickness mask has been employed, the pattern opening at its narrowest point between knife edges 17 also being 4 mils and at its widest openings (top and bottom) about 5 mils. Utilizing a mask as described, sputtered tungsten strips of approximately 5 mil widths were formed, aluminum deposited by vacuum deposition defining a 4.2 mil width strip centered on the lower tungsten strip.

It has been empirically determined that the knife edges 17 need not be located at the precise center of the thickness of the mask. Ideally, the knife edges have been found most effectively to function where they are disposed somewhere within the range of 25% to 50% downward from the uppermost edge of the mask.

While the instant process has been illustrated in conjunction the formation of terminations covering and electrically connecting exposed tabs extending from buried electrodes within a ceramic substrate, it should be readily recognized that such utilization of the process should by no means be taken in a limitative sense. The process may be usefully employed in any of a variety of situations where it is desired to deposit successive layers of metal of different widths without the necessity for re-masking. Elimination of the re-masking step is of particular importance in the fabrication of small sized precision electronic parts.

By the present method it is possible to readily deposit metals having idealized properties for particular applications. By way of example a first layer may be selected for its non-reactivity and adherence to the substrate. A second layer may be selected by virtue of its high conductivity but without regard to its ability to resist oxidation, since the second layer may readily be covered by a third layer which will function to isolate the second layer.

Numerous apparatuses well known to the art may be employed to effect the vapor deposition and sputtering steps. As will be apparent to skilled workers in the metalizing art, the specific deposition apparatus selected will depend in large degree upon the size of the object to be coated, the metal to be deposited, the rate of production desired, the quantity of metal necessarily deposited, and a variety of like factors. Also, numerous variations in details of the method hereof will occur to those skilled in the art and familiarized with the instant disclosure. Accordingly, the invention is to be broadly construed within the scope of the appended claims.

We claim:

1. The method of providing superposed or encapsulated metallic conductive paths on a dielectric substrate or the like, which comprises the steps of providing a mask member having an upper and a lower surface and an aperture formed therethrough, said aperture including a wide base portion at said lower surface and a constricted neck portion of lesser transverse dimension than said base portion intervening between said upper and lower surfaces, positioning said mask against a substrate with said lower surface in engagement with said substrate, thereafter depositing a metal pattern through said mask by a vacuum deposition step to thereby form a first metallic pattern conforming essentially to the transverse dimension in plan of said neck portion of said aperture and thereafter depositing metal through said aperture of said mask by a sputtering procedure to thereby form a second metal pattern in covering relation of said first metal pattern, said second metal pattern extending transversely beyond said first metal pattern and corresponding essentially to the dimensions in plan of said base portion of said aperture, whereby said first metal pattern is encapsulated beneath said second metal pattern.

2. The method in accordance with claim 1 wherein said first metal pattern is applied over a previous metal pattern deposited on said substrate through said mask, said previous metal pattern having been applied by sputtering, whereby the width of said previous metal pattern approximates the width of said base portion.

3. The method of forming on a substrate superposed metal areas of differing transverse dimension, which comprises the steps of providing a mask having an aperture formed therethrough, said aperture being characterized in that portion of said aperture at a lower surface of said mask are wider than other portions of said aperture, positioning said lower surface of said mask against a substrate, depositing a first metal layer over said substrate by a vapor deposition step through said mask to form a metallic pattern corresponding essentially to the dimensions in plan of said other portions of said aperture, and depositing a second metal layer over said substrate through said mask without removing said mask from said substrate by a sputtering step to form a metal pattern corresponding essentially with the dimensions in plan of said base portion, in covering relation of said first layer.

4. The method of claim 3 and including the step of sputter depositing a base metal layer on said substrate through said mask to define a metal pattern on said substrate corresponding essentially to the dimension in plan of said base portion in advance of depositing said first and second metal layers, whereby there is formed a three layer structure wherein said first metal layer is encapsulated between said base layer and said second metal layer.

5. The method in accordance with claim 3 wherein the dimensions of said aperture in said mask at said upper surface are greater than the dimensions of said other portions of said mask.

* * * * *